US009972631B2

(12) United States Patent
Chuang et al.

(10) Patent No.: US 9,972,631 B2
(45) Date of Patent: May 15, 2018

(54) MEMORY DEVICE AND METHOD OF MANUFACTURING THE SAME

(71) Applicant: Winbond Electronics Corp., Taichung (TW)

(72) Inventors: Che-Fu Chuang, Taichung (TW); Hsiu-Han Liao, Taichung (TW); Yao-Ting Tsai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days. days.

(21) Appl. No.: 15/352,594

(22) Filed: Nov. 16, 2016

(65) Prior Publication Data

US 2018/0047737 A1    Feb. 15, 2018

(51) Int. Cl.
| | | |
|---|---|---|
| *H01L 27/115* | (2017.01) | |
| *H01L 27/11521* | (2017.01) | |
| *H01L 29/788* | (2006.01) | |
| *H01L 29/423* | (2006.01) | |
| *H01L 29/49* | (2006.01) | |
| *H01L 29/417* | (2006.01) | |
| *H01L 21/28* | (2006.01) | |
| *H01L 29/66* | (2006.01) | |
| H01L 27/1157 | (2017.01) | |
| H01L 27/11524 | (2017.01) | |

(52) U.S. Cl.
CPC .. *H01L 27/11521* (2013.01); *H01L 21/28273* (2013.01); *H01L 29/41758* (2013.01); *H01L 29/42328* (2013.01); *H01L 29/4975* (2013.01); *H01L 29/66825* (2013.01); *H01L 29/7883* (2013.01); H01L 27/1157 (2013.01); H01L 27/11524 (2013.01)

(58) Field of Classification Search
CPC .................. H01L 27/11524; H01L 27/1157
USPC ............................... 257/319; 438/258
See application file for complete search history.

(56) References Cited

U.S. PATENT DOCUMENTS

| | | | | |
|---|---|---|---|---|
| 6,091,104 | A * | 7/2000 | Chen | G11C 16/0433 257/321 |
| 9,209,275 | B1 * | 12/2015 | Zou | H01L 29/66825 |
| 2003/0087493 | A1 * | 5/2003 | Jenq | H01L 27/11521 438/265 |
| 2004/0130947 | A1 * | 7/2004 | Fan | G11C 16/0433 365/185.05 |
| 2006/0203543 | A1 * | 9/2006 | Jeong | G11C 16/0425 365/185.01 |
| 2007/0126048 | A1 * | 6/2007 | Jeon | H01L 27/115 257/314 |
| 2009/0065845 | A1 | 3/2009 | Kim et al. | |

(Continued)

FOREIGN PATENT DOCUMENTS

| | | |
|---|---|---|
| TW | 200603171 | 1/2006 |
| TW | 201332088 | 8/2013 |
| TW | 201436113 | 9/2014 |

OTHER PUBLICATIONS

"Office Action of Taiwan Counterpart Application," dated Apr. 28, 2017, p. 1-p. 7.

*Primary Examiner* — George Fourson, III
(74) *Attorney, Agent, or Firm* — JCIPRNET (57) ABSTRACT

Provided is a memory device including a substrate and a gate structure. The gate structure is located on the substrate. The gate structure includes a stack gate and a selection gate aside the stack structure. A topmost surface of the selection gate is lower than a topmost surface of the stack gate.

6 Claims, 8 Drawing Sheets

(56) References Cited

U.S. PATENT DOCUMENTS

| | | | |
|---|---|---|---|
| 2010/0163960 A1* | 7/2010 | Park | H01L 27/11519 257/321 |
| 2015/0162412 A1* | 6/2015 | Chang | H01L 21/28282 257/316 |
| 2016/0204118 A1* | 7/2016 | Wu | H01L 29/7881 257/316 |
| 2017/0062440 A1* | 3/2017 | Arigane | H01L 21/28282 |
| 2017/0323980 A1* | 11/2017 | Amo | H01L 27/1157 |

* cited by examiner

MEMORY DEVICE AND METHOD OF MANUFACTURING THE SAME

CROSS-REFERENCE TO RELATED APPLICATION

This application claims the priority benefit of China application serial no. 201610666685.2, filed on Aug. 15, 2016. The entirety of the above-mentioned patent application is hereby incorporated by reference herein and made a part of this specification.

BACKGROUND OF THE INVENTION

Field of the Invention

The present invention relates to a semiconductor device and a fabrication method thereof. More particularly, the present invention relates to a memory device and a fabrication method thereof.

Description of Related Art

The flash memory includes stack gate flash memory and split gate flash memory. Compared to the stack gate flash memory, the split gate flash memory has the advantage of high programming efficiency, low power consumption, over-erase-preventing, and so on. However, the split gate flash memory has to increase additional split gate region, so that the whole memory cell size become larger, and the integration of memory device can't be increased.

SUMMARY OF THE INVENTION

The invention provides a memory device with separating gate and a method of fabricating the same, which has the features of high programming efficiency, interference reduction, and data retention-increasing and cycling endurance margin-increasing.

The invention provides a memory device, including a substrate and a gate structure. The gate structure is located on the substrate. The gate structure includes a stack gate and a selection gate aside the stack gate. A topmost surface of the selection gate is lower than a topmost surface of the stack gate.

The invention provides a memory device including a substrate, a source region, a drain region, at least two stack gates and at least two selection gates. The source region and drain region are both located in the substrate. The at least two stack gates are located on the substrate at two sides of the source region respectively. The at least two selection gates are located on the substrate at two sides of the drain region respectively. The distance between the at least two selection gates located at two sides of the drain region is greater than the distance between the at least two stack gates located at two sides of the source region.

The invention provides a method of fabricating a memory device, including the following steps. At least one doped region is foamed in a substrate. At least two gate structures are formed on the substrate at two sides of the at least one doped region respectively. Each of the at least two gate structures includes a stack gate and a selection gate aside the stack gate. A topmost surface of the selection gate is lower than a topmost surface of the stack gate. An intergate dielectric layer is formed between one of the at least two stack gates and a respective selection gate.

In view of the above, the invention provides a memory device and a method of fabricating the same, wherein the stack gate and selection gate are formed in the stack gate region of the conventional memory device. Under the circumstances of not increasing the gate area, the memory device of the present invention can have effects of high programming efficiency, interference reduction, low power consumption, data retention-increasing and cycling endurance margin-increasing, over-erase-preventing, and so on.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Example embodiments will now be described more fully with reference to the accompanying drawings, in which example embodiments are shown. In the drawings, the thicknesses of layers and regions are exaggerated for clarity Referring to FIG. 1A, a conventional memory device 10 includes a substrate 100, a plurality of stack gates 12, at least one source region 22, a plurality of drain regions 24, a plurality of word lines WL, and a plurality of active regions AA. The word lines WL extend along a first direction D1, and alternately arrange along a second direction D2. The active areas AA extend along the second direction D2, and arrange alternately along the first direction D1. The overlapped or crossover regions between the active areas AA and the word lines WL are stack gate 12 regions.

Figure 1A:
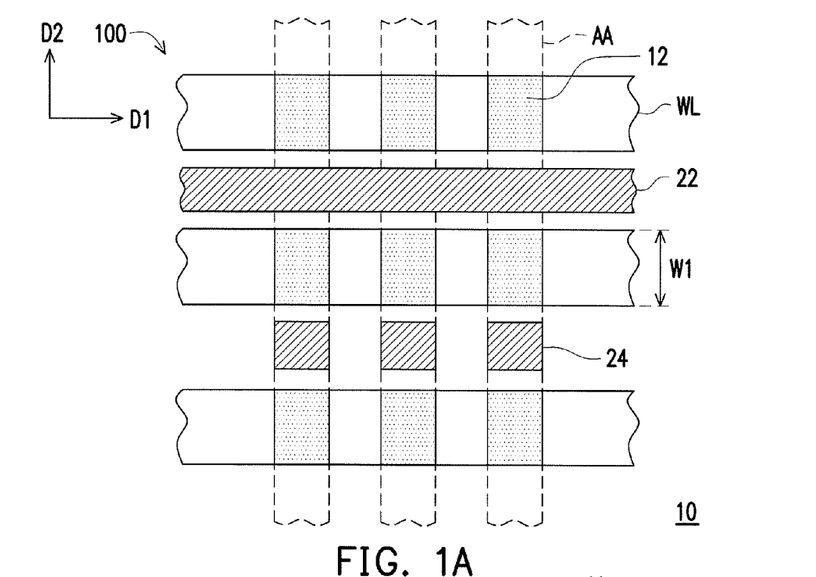
FIG. 1A is a schematic top view of a conventional memory device.
Figure 1B:
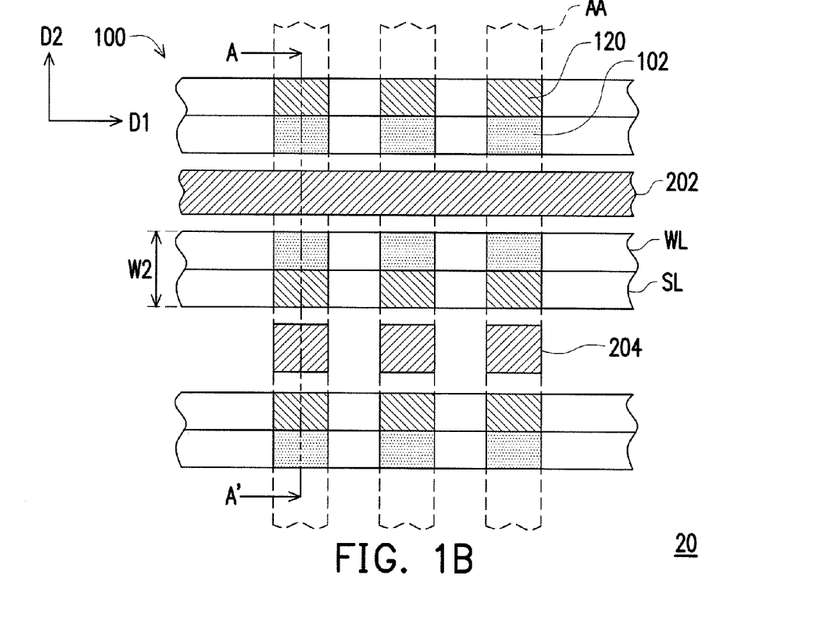
FIG. 1B is a schematic top view of a memory device according to the first embodiment of the present invention.

Referring to FIG. 1B, a memory device 20 according to the first embodiment of the present invention includes a substrate 100, a plurality of stack gates 102, a plurality of selection gates 120, at least one source regions 202, a plurality of drain regions 204, a plurality of word lines WL, a plurality of selection lines SL, and a plurality of active regions AA. The word lines WL are located aside the selection lines SL. Both of the word lines WL and the selection lines SL extend along the first direction D1, and arrange alternately along the second direction D2. The active areas AA extend along the second direction D2, and arrange alternately along the first direction D1. The overlapped or crossover regions between the active areas AA and the word lines WL are stack gate 102 regions. The overlapped or crossover regions between the active areas AA and the selection lines SL are selection gate 120 regions. The stack gates 102 are located at two sides of each of the source regions 202 respectively; and the selection gates 120 are located at two sides of each of the drain regions 204 respectively.

Referring to FIGS. 1A and 1B simultaneously, a width W1 of each of the conventional stack gates 12 are equal to a width W2 of a sum of each of the stack gates 102 and each of the selection gates 120 of the embodiment. In other words, the stack gates 102 and the selection gates 120 of the embodiment are formed in the regions of the conventional stack gates. Therefore, under the circumstance of not increasing the gate area, the memory device 20 of the embodiment can have advantages of having the stack gates and the selection gates simultaneously.

Detailed description of the fabricating process of the memory device in the embodiment is provided hereafter with schematic cross-sectional view taken along line A-A' of FIB. 1B.

Figure 2A:
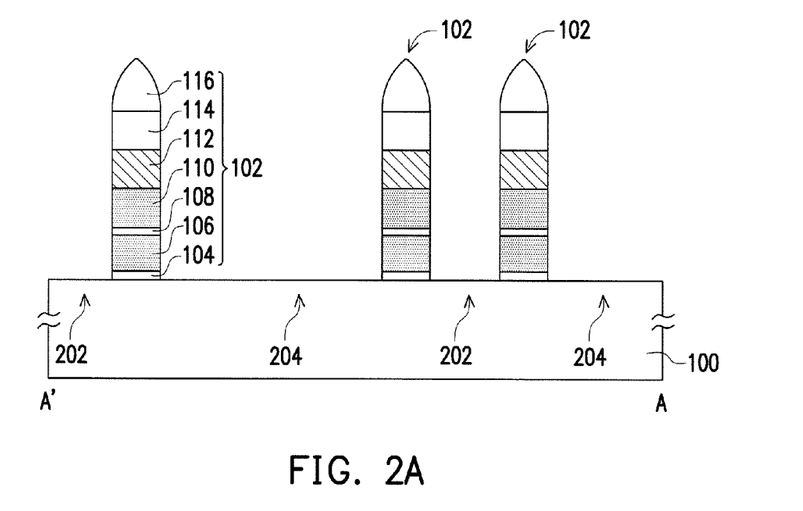
FIGS. 2A to 2K are schematic cross-sectional view illustrating a fabricating process of the memory device according to the second embodiment taken along line A-A' of FIG. 1B.

Referring to FIG. 2A, the second embodiment of the present invention provides a method of fabricating a memory device, including the following steps. First of all, a substrate 100 is provided. In the embodiment, the substrate 100 may be a semiconductor substrate, a semiconductor compound substrate, or a semiconductor over insulator, for example.

Then, doped regions 202, 204 are formed in the substrate 100. In an embodiment, the doped regions 202 may be source regions (hereinafter "source regions 202"); and the doped regions 204 may be drain regions (hereinafter "drain regions 204"), for example. The source regions 202 and the drain regions 204 are alternately arranged but not overlapped.

Thereafter, a plurality of stack gates 102 are formed on the substrate 100. In detail, one of the stack gates 102 is formed by sequentially stacking a tunneling dielectric layer 104, a floating gate 106, an intergate dielectric layer 108, a first control gate 110, a second control gate 112, and dielectric layers 114, 116. In the embodiment, the tunneling dielectric layer 104 may include silicon oxide, for example, and a method of forming the tunneling dielectric layer 104 may include chemical vapor deposition, thermal oxidation, and so on. The floating gate 106 may include doped polysilicon, undoped polysilicon, or a combination thereof, for example, and a method of forming the floating gate 106 may include chemical vapor deposition. The intergate dielectric layer 108 may be a composite layer of oxide/nitride/oxide, and the composite layer may include three or more layers, for example. However, the invention is not limited thereto. A method of forming the intergate dielectric layer 108 may include chemical vapor deposition. The first control gate 110 may include doped polysilicon, undoped polysilicon, or a combination thereof, for example, and a method of forming the first control gate 110 may include chemical vapor deposition. The second control gate 112 may include metal silicide, for example, and the metal silicide may be tungsten silicide, for example. A method of forming the second control gate 112 may include chemical vapor deposition. The dielectric layers 114, 116 may be a single-layered structure, a double-layered structure, or a multi-layered structure, for example. In the embodiment, the dielectric layer 114 may include a silicon nitride, for example; and the dielectric layer 116 may include a silicon oxide, a tetraethosiloxane oxide or a combination thereof. A method of forming the dielectric layers 114, 116 may include chemical vapor deposition.

It should be noted that, the stack gates 102 are located between the source regions 202 and the drain regions 204 respectively. In order to form the selection gates 120 (as shown in FIG. 2G) on the substrate 100 at two sides of each of the drain regions 204 in subsequent process, in this step, a distance between the stack gates 102 at two sides of each of the drain regions 204 is greater than a distance between the stack gates 102 at two sides of each of the source regions 202.

Figure 2B:
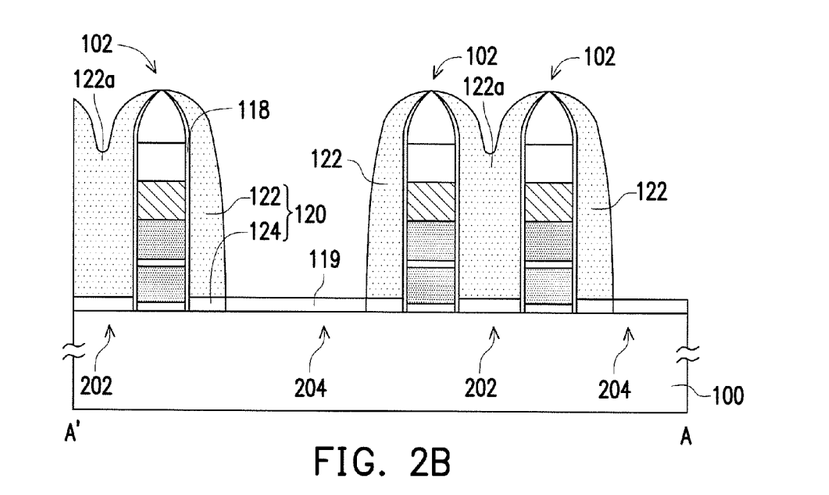

Referring to FIG. 2B, an intergate dielectric layer 118 is formed at two sides of each of the stack gates 102. In detail, first of all, the intergate dielectric material layer (not shown) is formed on the substrate 100 to cover surfaces of the stack gates 102 and the substrate 100. Then, an anisotropic etching process is performed to remove a portion of the intergate dielectric material layer, so as to expose top surfaces of the stack gates 102. In an embodiment, the intergate dielectric layer 118 may be a single-layered structure, a double-layered structure, or a multi-layered structure, for example. In the embodiment, the intergate dielectric layer 118 may be a triple-layered structure, for example. One oxide layer, a nitride layer, and another oxide layer are sequentially formed along an extending direction from an inner side of the stack gates 102 to outside. It should be noted that, an outermost oxide layer is formed by an in-situ steam generation, therefore, a middle nitride layer may be changed to an oxide layer or a silicon oxynitride layer. Moreover, when forming the intergate dielectric layer 118, a portion of the intergate dielectric material layer covers the surface of the substrate 100 to form pad layers 119, so that the damage to the surface of the substrate 100 due to the subsequent deposition or etching process can be avoided. Another portion of the intergate dielectric material layer is located aside the tunneling dielectric layer 104 and the floating gate 106, so as to forms gate dielectric layers 124.

Thereafter, a selection gate material layer (not shown) is formed on the substrate 100 to cover the surfaces of the stack gates 102 and substrate 100. Then, an anisotropic etching process is performed to remove a portion of the selection gate material layer, such that surfaces of the pad layers 119 are exposed. At this time, the selection gate material layer on the gate dielectric layers 124 may be referred as selection gate electrodes 122. One of the selection gate electrodes 122 and the respective gate dielectric layer 124 constitute one selection gate 120. That is, the selection gates 120 are formed on the sidewalls of the stack gates 102 at two sides of each of the drain regions 204 with a spacer form. In an embodiment, the selection gate electrodes 122 may include doped polysilicon, undoped polysilicon, or a combination thereof, for example, and a method of forming the selection gate electrodes 122 may be chemical vapor deposition. The gate dielectric layers 124 may include a silicon oxide, a silicon oxynitride, or a combination thereof, for example, and a method of forming the gate dielectric layers 124 may be chemical vapor deposition.

It should be noted that, since the distance between the stack gates 102 located at two sides of each of the source regions 202 is smaller than the distance between the stack gates 102 located at two sides of each of the drain regions 204, when removing the portion of the selection gate material layer, the surfaces of the pad layers 119 located on the source regions 202 are not exposed. That is, the portion of the selection gate material layer still remains on the source regions 202 to form selection gate electrodes 122a. As shown in FIG. 2B, each of the selection gate electrodes 122a located between the stack gates 102 at two sides of each of the source regions 202 may be a continuous structure, and a top surface of each of the selection gate electrodes 122a has a recessed surface.

Figure 2C:
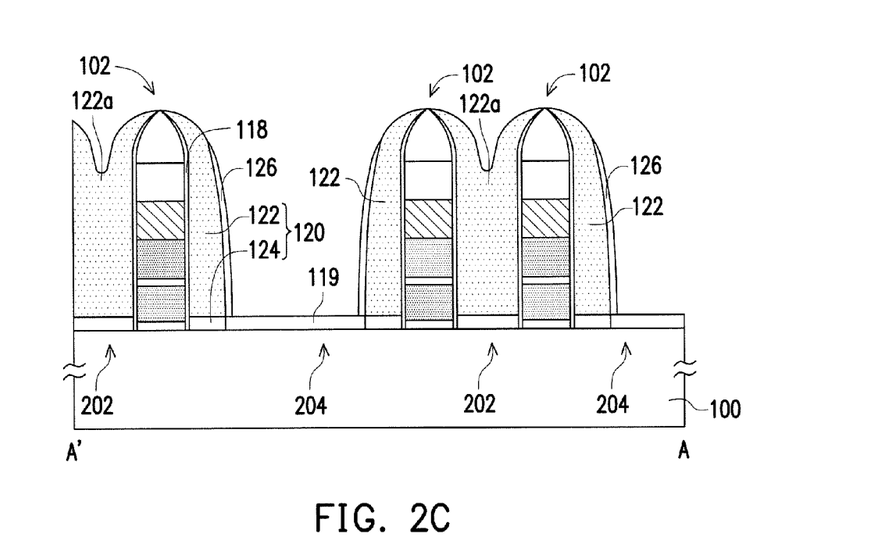

Referring to FIG. 2C, dielectric layers 126 are formed on sidewalls of the selection gates 120, wherein a topmost surface of each of the dielectric layers 126 is lower than a topmost surface of each of the stack gates 102 (or a topmost surface of each of the selection gate 120). Specifically, a method of forming the dielectric layers 126 is similar to the foregoing method of forming the selection gates 122. In an embodiment, the dielectric layers 126 may include silicon nitride, for example.

Figure 2D:
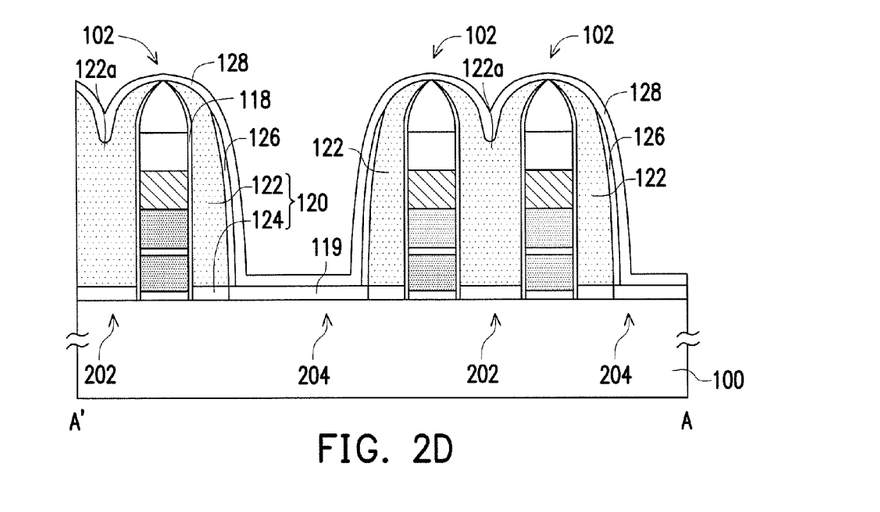

Referring to FIG. 2D, a dielectric layer 128 is conformally formed on the substrate 100. The dielectric layer 128 may include silicon oxide, tetraethosiloxane oxide or a combination thereof, for example. A method of forming the dielectric layer 128 may be chemical vapor deposition.

Figure 2E:
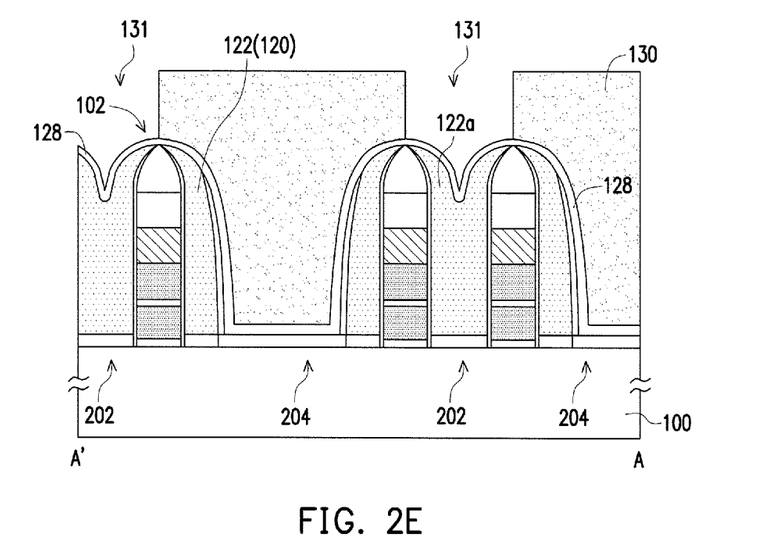

Referring to FIG. 2E, a patterned photoresist layer 130 is formed on the substrate 100. Specifically, the patterned photoresist layer 130 has openings 131. The openings 131 expose a portion of a surface of the dielectric layer 128. On the other hand, the patterned photoresist layer 130 covers and protects a region which the selection gates 120 are expected to be formed (that is, the selection gates 120 located at two sides of each of the drain regions 204).

Figure 2F:
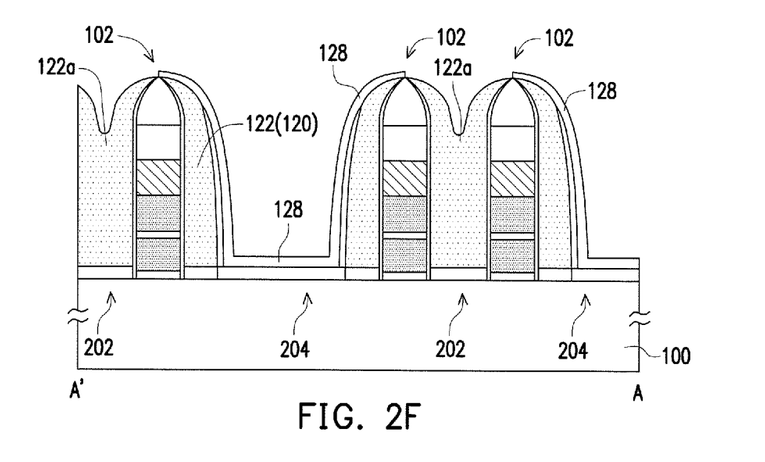
Figure 2G:
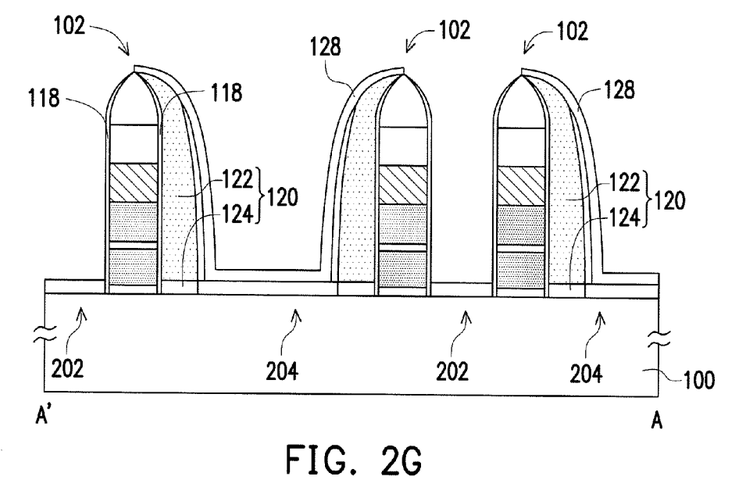

Referring to FIGS. 2E and 2F, an etching process is performed to remove the portion of the dielectric layer 128 by using the patterned photoresist layer 130 as a mask. In an embodiment, the etching process may be a dry etching process, and the dry etching process may be a reactive ion etching. Afterwards, the patterned photoresist layer 130 is further removed.

Referring to FIGS. 2F and 2G, an etching process is performed to remove selection gate electrode 122a by using the rest of the dielectric layer 128 as a mask. In other words, after performing the etching process, the selection gate electrode 122a located on sidewalls of the stack gates 102 at two sides of each of the source regions 202 are removed. Only the selection gate electrode 122 (i.e., the selection gate 120) located on the sidewalls of the stack gates 102 at two sides of each of the drain regions 204 are remained.

Figure 2H:
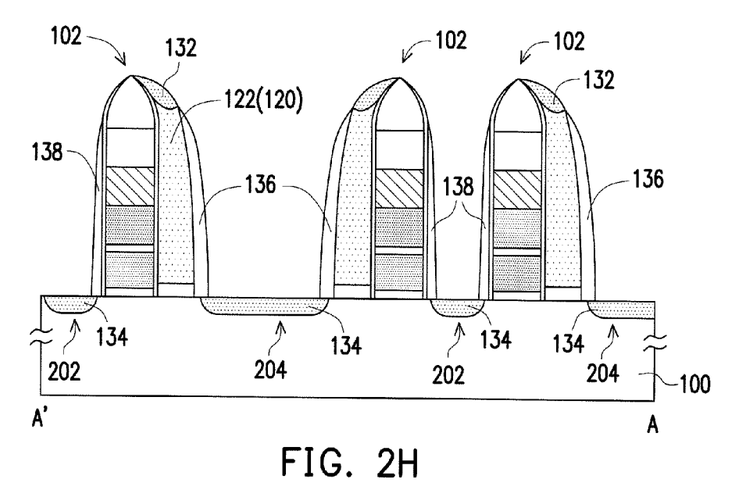

Referring to FIGS. 2G and 2H, a spacer 136 is formed on the sidewall of each of the selection gates 120, and a spacer 138 is formed on the sidewall of each of the stack gates 102, so as to avoid the subsequent etching process to damage the stack gates 102 and the selection gates 120. In an embodiment, the spacers 136, 138 may include an oxide or a nitride or a combination thereof, for example, and a method of forming the spacers 136, 138 may be chemical vapor deposition. It should be noted that, after forming the spacers 136, 138, the top surfaces of the selection gates 120, source regions 202, and drain regions 204 are exposed. Thereafter, performing a metal silicide process to simultaneously form metal silicide layers 132, 134 on the top surfaces of the selection gates 120, source regions 202, and drain regions 204 respectively.

In detail, the metal silicide process includes following steps. First of all, the metal layer (not shown) is formed on the substrate 100 to contact with the top surfaces of the selection gates 120, source regions 202, and drain regions 204. In an embodiment, the metal layer may include W, Ti, Co, Ta, Ni, Pt, Pd, or an alloy thereof, for example. However, as long as a metal silicide material may be formed by the metal layer and a silicon-containing substrate 100 or the metal layer and a silicon-containing selection gates 120, the metal layer falls within the scope of the invention. Then, a first anneal process is performed, so that the metal layer reacts with the silicon-containing selection gates 120, the silicon-containing source regions 202, and the silicon-containing drain regions 204 contacted therewith, to form the metal silicide layers 132, 134 respectively. In an embodiment, the metal silicide layer 132, 134 may include tungsten silicide, titanium silicide, cobalt silicide, tantalum silicide, nickel silicide, platinum silicide, palladium silicide or a combination thereof. Then, a selective etching process is performed to remove the unreacted metal layer. Thereafter, a second anneal process is performed to reduce the resistance of the metal silicide layers 132, 134.

Figure 2I:
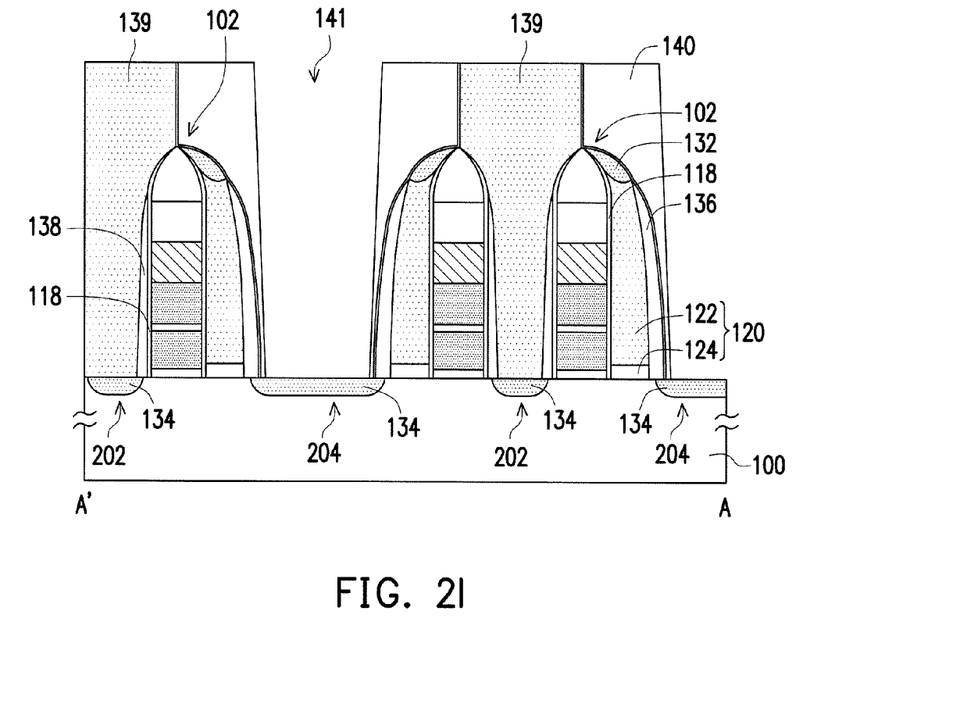

Referring to FIGS. 2H and 2I, the patterned sacrifice layers 139 are formed on the source regions 202 of the substrate 100. The patterned sacrifice layers 139 fill the trenches or spaces on the source regions 202, and defines the region which the source contacts 142 is expected to be formed in subsequent process (as shown in FIG. 2K). In an embodiment, the patterned sacrifice layers 139 may include doped polysilicon, undoped polysilicon, or a combination thereof, for example, and a method of forming the patterned sacrifice layers 139 may be chemical vapor deposition.

Then, dielectric layers 140 are formed on the substrate 100. The dielectric layers 140 fills the trenches or spaces on the drain regions 204, and covers the surfaces of the stack gates 102, the selection gates 120, the metal silicide layers 132, and the patterned sacrifice layers 139. In an embodiment, the dielectric layers 140 may include a material having better step coverage, such as spin-on glass, borophosphosilicate glass, phosphosilicate glass or a combination thereof, for example, and a method of forming the dielectric layers 140 may be chemical vapor deposition. Thereafter, a CMP process is performed to planarize the top surfaces of the dielectric layers 140.

Then, the lithography and etching process are performed on the dielectric layers 140 to form contact openings 141 on the drain regions 204. The contact openings 141 expose the surfaces of the metal silicide layers 134 on the drain regions 204. The contact openings 141 define the region which the contacts 144 are expected to be formed in subsequent process (as shown in FIG. 2K).

Figure 2J:
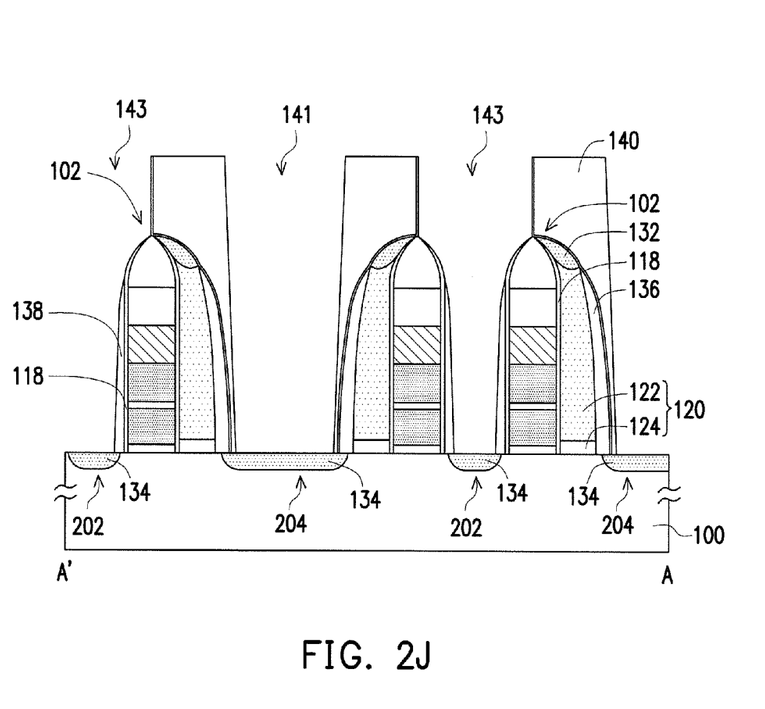
Figure 2K:
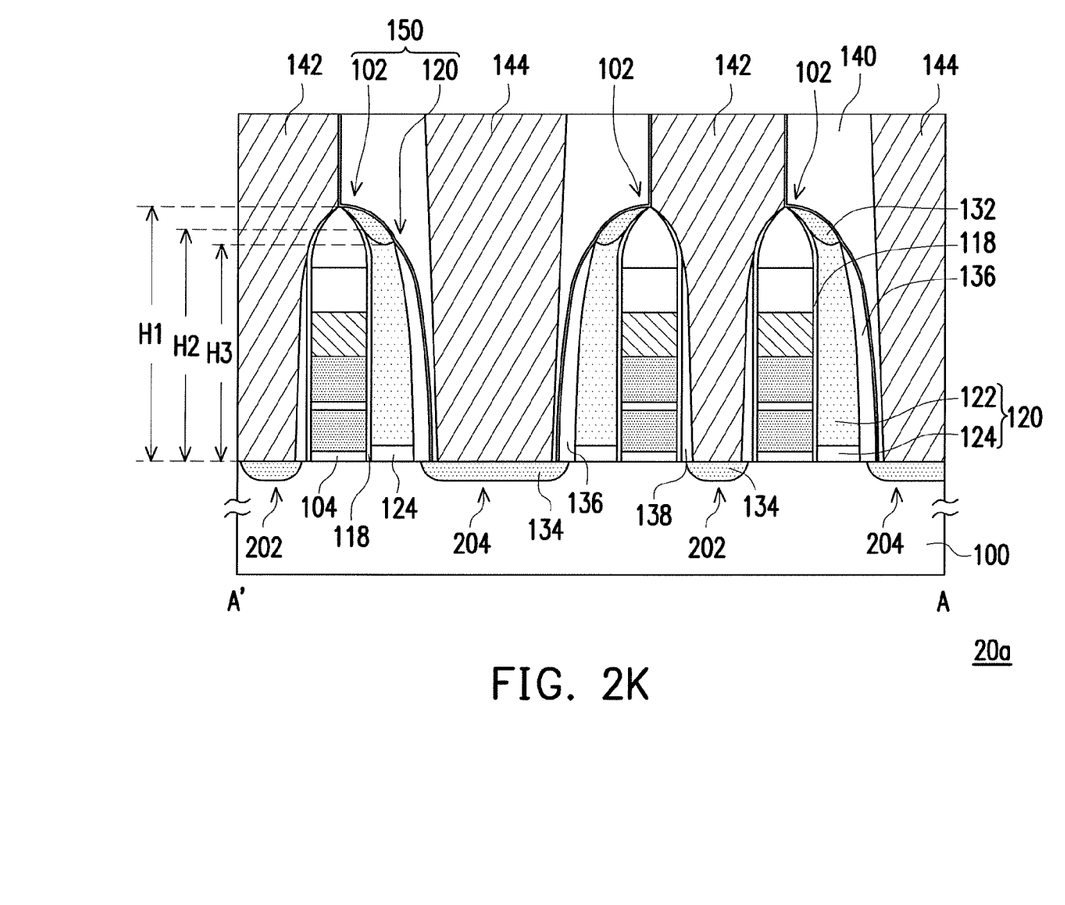

Referring to FIGS. 2I and 2J, the patterned sacrifice layers 139 are removed to form contact openings 143. The contact openings 143 expose the surfaces of the metal silicide layers 134 on the source regions 202.

Referring to FIGS. 2J and 2K, a conductive material fills the contact openings 141, 143 to form the drain contacts 144 and source contacts 142 respectively. In an embodiment, the source contacts 142 and drain contacts 144 may include tungsten, and a method of forming the source contacts 142 and drain contacts 144 may be physical vapor deposition.

Referring to FIG. 2K, a second embodiment of the present invention includes the substrate 100, gate structures 150, the source regions 202, the drain regions 204, the source contacts 142, and the drain contacts 144. The gate structures 150 are located on the substrate 100. Each of the gate structures 150 includes one stack gate 102 and one selection gate 120 aside the respective stack gate 102. The topmost surface of each of the selection gates 120 is lower than the topmost surface of each of the stack gates 102. In detail, the top surface of each of the selection gate 120 is non-planar. The height of one of the selection gates 120 gradually decreases along a direction away from the adjacent stack gate 102. That is, the height H2 of one of the selection gates 120 gradually decreases to height H3. In an embodiment, a height ratio of the heights H2, H3 of one of the selection gates 120 to the height H1 of one of the stack gates 102 is 0.92:1 to 0.84:1, for example.

Furthermore, each of the selection gates 120 has the gate dielectric layer 124. Each of the stack gate 102 has the tunneling dielectric layer 104. A thickness of each of the gate dielectric layers 124 may be greater than a thickness of each of the tunneling dielectric layers 104, so as to bear a high voltage when operating the memory device 20a. In an embodiment, the gate dielectric layer 124 may include silicon oxide, silicon oxynitride or a combination thereof, for example. Moreover, the metal silicide layers 132 are formed on the top surfaces of the selection gates 120, so as to reduce the resistance thereof. The intergate dielectric layer 118 is formed between one of the stack gates 102 and the respective selection gate 120, so as to electrically isolate the one of the stack gates 102 and the respective selection gate 120.

As shown in FIG. 2K, both of the source regions 202 and the drain regions 204 are located in the substrate 100. The number of the source regions 202 and the drain regions 204 are plural, and the source regions 202 and the drain regions 204 are alternately arranged but not overlapped. The two sides of each of the source regions 202 and the two sides of each of the drain regions 204 have the gate structures 150 respectively. The difference is, the stack gates 102 of the gate structures 150 are near and adjacent to the two sides of each of the source regions 202; and the selection gates 120 of the gate structures 150 are near and adjacent to the two sides of each of the drain regions 204.

Furthermore, the source contacts 142 are located on the source regions 202. The source contacts 142 are electrically connected with the source regions 202 by the metal silicide layers 134, so as to reduce the resistance of the source contacts 142. The drain contacts 144 are located on the drain regions 204. The drain contacts 144 are electrically connected with the drain regions 204 by the metal silicide layers 134, so as to reduce the resistance of the drain contacts 144. In detail, a bottom area of each of the drain contacts 144 is greater than a bottom area of each of the source contacts 142, therefore, the distance between the selection gates 120 at two sides of each of the drain contacts 144 is greater than the distance between the stack gates 102 at two sides of each of the source contacts 142. In an embodiment, the source contacts 142 may be self-align contacts; and the drain contacts 144 are not self-align contacts.

Moreover, the memory device 20a in the embodiment further includes the spacers 136, 138 located on the sidewalls of the gate structures 150 respectively. According to the FIG. 2K, a thickness of each of the spacers 136 located on the sidewall of the selection gates 120 may be greater than the thickness of each of the spacer 138 located on the sidewall of the stack gates 102, so as to prevent the damage to the gate structures 150 from an etching process of forming the drain contacts 144.

Based on the foregoing, the present invention provides a memory device and a method of forming the same. The stack gates and the selection gates are formed in the stack gate regions of the conventional memory device. Under the circumstances of not increasing the gate area, the present invention can have effects of high programming efficiency, interference reduction, low power consumption, data retention-increasing and cycling endurance margin-increasing, over-erase-preventing, and so on.

What is claimed is:

1. A memory device, comprising:
a gate structure, located on a substrate, wherein the gate structure comprises:
a stack gate; and
a selection gate, located aside the stack gate, wherein a top surface of the selection gate is a recessed surface, and a topmost surface of the selection gate is lower than a topmost surface of the stack gate.

2. The memory device of claim 1, wherein a height of the selection gate gradually decreases along a direction away from the stack gate.

3. The memory device of claim 1, wherein a height ratio of a height of the selection gate to a height of the stack gate is 0.92:1 to 0.84:1.

4. The memory device of claim 1, wherein the selection gate has a gate dielectric layer, the stack gate has a tunneling dielectric layer, and a thickness of the gate dielectric layer is greater than a thickness of the tunneling dielectric layer.

5. The memory device of claim 1, further comprising an intergate dielectric layer located between the stack gate and the selection gate.

6. The memory device of claim 1, further comprising a metal silicide layer located on a top surface of the selection gate, wherein the metal silicide layer comprises tungsten silicide, titanium silicide, cobalt silicide, tantalum silicide, nickel silicide, platinum silicide, palladium silicide or a combination thereof.

* * * * *